(12) United States Patent
Inoue et al.

(10) Patent No.: US 9,716,168 B2
(45) Date of Patent: Jul. 25, 2017

(54) SILICON CARBIDE SEMICONDUCTOR DEVICE, METHOD OF MANUFACTURING SILICON CARBIDE SEMICONDUCTOR DEVICE AND METHOD OF DESIGNING SILICON CARBIDE SEMICONDUCTOR DEVICE

(71) Applicant: Shindengen Electric Manufacturing Co., Ltd., Tokyo (JP)

(72) Inventors: Tetsuto Inoue, Hanno (JP); Akihiko Sugai, Hanno (JP); Shunichi Nakamura, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 92 days.

(21) Appl. No.: 14/774,129

(22) PCT Filed: Sep. 24, 2014

(86) PCT No.: PCT/JP2014/075192
§ 371 (c)(1),
(2) Date: Sep. 9, 2015

(87) PCT Pub. No.: WO2016/046900
PCT Pub. Date: Mar. 31, 2016

(65) Prior Publication Data
US 2016/0293753 A1    Oct. 6, 2016

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0619* (2013.01); *H01L 29/0623* (2013.01);
(Continued)

(58) Field of Classification Search
CPC ............. H01L 29/0619; H01L 29/0623; H01L 29/0692; H01L 29/1608; H01L 29/404;
(Continued)

(56) References Cited

U.S. PATENT DOCUMENTS

2006/0189063 A1* 8/2006 Hueting ............. H01L 29/7813
438/209
2009/0283776 A1   11/2009 Iwamuro
(Continued)

FOREIGN PATENT DOCUMENTS

JP    6-132539    5/1994
JP    2009-278067    11/2009
(Continued)

OTHER PUBLICATIONS

International Search Report mailed on Dec. 22, 2014 for PCT/JP2014/075192.
(Continued)

*Primary Examiner* — Tod T Van Roy
*Assistant Examiner* — Delma R Forde
(74) *Attorney, Agent, or Firm* — Ladas & Parry, LLP

(57) ABSTRACT

A silicon carbide semiconductor device includes a silicon carbide layer 32 of a first conductivity type, a silicon carbide layer 36 of a second conductivity type, a gate trench 20, a gate electrode 79 provided in the gate trench 20, and a protection trench 10 formed to a depth greater than the gate trench 20. A region in the horizontal direction that includes both the gate trench 20 and a protection trench 10 that surrounds the gate trench 20 with at least a part of the gate trench 20 left unenclosed is a cell region, and a region in the horizontal direction that includes a protection trench 10 and in which a gate pad 89 or a lead electrode connected to the gate pad is disposed is a gate region.

13 Claims, 7 Drawing Sheets

(51) Int. Cl.
  *H01L 29/16* (2006.01)
  *H01L 29/40* (2006.01)
  *H01L 29/66* (2006.01)
  *H01L 29/423* (2006.01)

(52) U.S. Cl.
  CPC ...... *H01L 29/0696* (2013.01); *H01L 29/1608* (2013.01); *H01L 29/404* (2013.01); *H01L 29/407* (2013.01); *H01L 29/4238* (2013.01); *H01L 29/66068* (2013.01); *H01L 29/7811* (2013.01)

(58) Field of Classification Search
  CPC ............... H01L 29/407; H01L 29/4238; H01L 29/66068; H01L 21/8213; H01L 2924/10272; H01L 29/0696; H01L 29/66712–29/66734; H01L 29/7802–29/7815
  See application file for complete search history.

(56) References Cited

U.S. PATENT DOCUMENTS

| | | | |
|---|---|---|---|
| 2013/0228866 A1 | 9/2013 | Lee et al. | |
| 2016/0172372 A1* | 6/2016 | Yun | H01L 27/11582 257/321 |
| 2016/0254356 A1* | 9/2016 | Inoue | G06F 17/5068 257/77 |
| 2016/0293753 A1 | 10/2016 | Inoue et al. | |
| 2017/0018635 A1* | 1/2017 | Tsuyuki | H01L 29/7397 |

FOREIGN PATENT DOCUMENTS

| | | |
|---|---|---|
| JP | 2012164851 A | 8/2012 |
| JP | 2012-238769 | 12/2012 |
| JP | 2012-243985 | 12/2012 |

OTHER PUBLICATIONS

Written Opinion of the International Search Authority dated Dec. 12, 2014 for PCT/JP2014/075192 and its English translation from WIPO.

PCT Search Report dated Dec. 22, 2014 for PCT/JP2014/075192 and its English translation from WIPO.

PCT International Preliminary Report on Patentability (Chapter I) dated Dec. 22, 2014 for PCT/JP2014/075192 and its English translation from WIPO.

Written Opinion of the International Search Authority dated Dec. 22, 2014 for PCT/JP2014/075193 mailed on Dec. 22, 2014 and its English translation from WIPO.

PCT Search Report dated Dec. 22, 2014 for PCT/JP2014/075193 and its English translation from WIPO.

PCT International Preliminary Report on Patentability (Chapter I) dated Dec. 22, 2014 for PCT/JP2014/075193 and its English translation from WIPO.

U.S. Appl. No. 14/787,982, Notice of Allowance mailed on Feb. 14, 2017.

U.S. Appl. No. 14/787,982, Office Action mailed on Aug. 19, 2016.

\* cited by examiner

SILICON CARBIDE SEMICONDUCTOR DEVICE, METHOD OF MANUFACTURING SILICON CARBIDE SEMICONDUCTOR DEVICE AND METHOD OF DESIGNING SILICON CARBIDE SEMICONDUCTOR DEVICE

CROSS-REFERENCE TO RELATED APPLICATION(S)

This application is the U.S. National Stage of International Patent Application No. PCT/JP2014/075192 filed on Sep. 24, 2014, the disclosure of which is incorporated in its entirety herein by reference.

TECHNICAL FIELD

The present invention relates to a silicon carbide semiconductor device, which is made of silicon carbide, a method of manufacturing the silicon carbide semiconductor device, and a method of designing the silicon carbide semiconductor device.

BACKGROUND ART

There are known conventional semiconductor devices made of silicon, such as a trench-type Si-MOSFET. Japanese Patent Laid-Open No. 06-132539 discloses a semiconductor device having a vertical insulated gate bipolar transistor that includes a semiconductor substrate of a first conductivity type, a first semiconductor layer of the first conductivity type of low impurity concentration formed on the principal surface of the semiconductor substrate, a second semiconductor layer of a second conductivity type formed on the upper surface of the first semiconductor layer, a third semiconductor layer of the first conductivity type formed on a part of a surface part of the second semiconductor layer, a gate oxide film formed on an inner wall surface of a gate trench, which has a substantially U-shaped cross section and extends from the surface of a central part of the third semiconductor layer through a part of the second semiconductor layer into the first semiconductor layer, a gate electrode formed to fill a groove on the gate oxide film, an insulating film formed to cover the gate electrode and an exposed surface of the second semiconductor layer, a gate wire that is formed on the insulating film and is in contact with the gate electrode, a source electrode that is in contact with the third semiconductor layer through a contact hole formed in the insulating film, and a drain electrode formed on the back surface of the semiconductor substrate. Japanese Patent Laid-Open No. 06-132539 discloses a structure in which the gate trench is formed in a ring-like shape.

A silicon carbide semiconductor device made of silicon carbide, such as a SiC-MOSFET, has a high breakdown voltage, so that the gate trench can be insufficient to prevent the electrical field from excessively concentrated in the gate oxide film during reverse biasing, and the gate oxide film can break.

To avoid this, a protection trench can be disposed around the gate trench to prevent an electrical field from being applied to the gate trench. However, such a protection trench can fail to prevent an electrical field from being locally excessively concentrated during reverse biasing because of the interval between sections of the protection trench or the shape of the protection trench in plan view (in the horizontal direction), for example. If an electrical field is locally excessively concentrated in the protection trench, the withstand voltage of the protection trench decreases, and a desired withstand voltage cannot be achieved. In addition, if there is a part that has a low withstand voltage, a problem arises in that the avalanche resistance decreases.

SUMMARY OF THE INVENTION

Problems to be Resolved by the Invention

In view of the circumstances described above, the present invention provides a silicon carbide semiconductor device that adopts a protection trench and can prevent an electrical field from being locally excessively concentrated in the protection trench during reverse biasing, thereby improving the avalanche resistance, a method of manufacturing the silicon carbide semiconductor device, and a method of designing the silicon carbide semiconductor device.

Means of Solving the Problem

A silicon carbide semiconductor device according to the present invention, the silicon carbide semiconductor device comprising:
a silicon carbide layer of a first conductivity type;
a silicon carbide layer of a second conductivity type formed on the silicon carbide layer of the first conductivity type;
a gate trench formed to extend from a surface of the silicon carbide layer of the second conductivity type to such a depth that the gate trench reaches the silicon carbide layer of the first conductivity type;
a gate electrode provided in the gate trench with an insulating film interposed therebetween;
a protection trench formed to extend from the surface of the silicon carbide layer of the second conductivity type to a depth greater than the gate trench; and
a conductive member provided in the protection trench,
wherein a region in a horizontal direction that includes both the gate trench and a protection trench that surrounds the gate trench with at least a part of the gate trench left unenclosed in the horizontal direction is a cell region,
a region in the horizontal direction that includes a protection trench and in which a gate pad or a lead electrode connected to the gate pad is disposed is a gate region,
the protection trench included in the cell region has a plurality of cell-region linear trench sections that extend straight in the horizontal direction, and
a horizontal distance between the cell-region linear trench sections is greater than a maximum horizontal distance between sections of the protection trench included in the gate region.

In the silicon carbide semiconductor device, the horizontal distance between the cell-region linear trench sections is greater than a maximum horizontal distance between the protection trench included in the cell region and the protection trench included in the gate region.

In the silicon carbide semiconductor device, the protection trench included in the cell region has a cell-region curved trench section that is curved in the horizontal direction and located at an end of the cell-region linear trenches, and
the horizontal distance between the cell-region linear trench sections is greater than a maximum horizontal distance between the cell-region curved trench section and the protection trench included in the gate region.

In the silicon carbide semiconductor device, the protection trench included in the gate region has a gate-region linear trench section that extends straight in the horizontal direction and a gate-region curved trench section that is curved in the horizontal direction, the gate region includes a linear gate sub-region in which a plurality of gate-region linear trenches extend in the horizontal direction and a curved gate sub-region in which a plurality of gate-region curved trench sections extend in the horizontal direction, and a horizontal distance between the gate-region linear trench sections in the linear gate sub-region is greater than a horizontal distance between the gate-region curved trench sections in the curved gate sub-region.

In the silicon carbide semiconductor device, the gate trench extends straight in the horizontal direction.

In the silicon carbide semiconductor device, the gate trench and the cell-region linear trench sections extend in parallel with each other in the horizontal direction.

In the silicon carbide semiconductor device, the protection trench included in the cell region has a pair of cell-region linear trench sections and a cell-region curved trench section that is curved in the horizontal direction, the cell-region curved trench is located at a first end of the pair of cell-region linear trench sections, and the gate trench is located between the pair of cell-region linear trench sections in the horizontal direction.

In the silicon carbide semiconductor device, the protection trench included in the gate region has a gate-region curved trench section that is curved in the horizontal direction, and a gate-region curved trench section that protrudes toward the gate trench in the horizontal direction is disposed at a second end of the pair of cell-region linear trench sections.

In the silicon carbide semiconductor device, a gate-region curved trench section that protrudes toward the gate-region curved trench section that protrudes toward the gate trench is provided adjacent to the gate-region curved trench section that protrudes toward the gate trench.

In the silicon carbide semiconductor device, the protection trench included in the cell region has three or more cell-region linear trench sections that extend straight in the horizontal direction, and the horizontal distances between the cell-region linear trench sections are uniform.

In the silicon carbide semiconductor device, the silicon carbide semiconductor device further comprising:

a guard ring that surrounds the gate region and the cell region in the horizontal direction, wherein the protection trench included in the gate region has three or more gate-region linear trench sections that extend straight in the horizontal direction, the gate-region linear trenches are provided adjacent to, and in parallel with, at least a part of the guard ring, and a horizontal distance between the gate-region linear trench section that is closest to the guard ring and the gate-region linear trench section that is adjacent to the gate-region liner trench section that is closest to the guard ring is smaller than a minimum horizontal distance between the other gate-region linear trench sections.

A method of manufacturing a silicon carbide semiconductor device according to the present invention, comprising:

a step of forming a silicon carbide layer of a first conductivity type;

a step of forming a silicon carbide layer of a second conductivity type on the silicon carbide layer of the first conductivity type;

a step of forming a gate trench that extends from a surface of the silicon carbide layer of the second conductivity type to such a depth that the gate trench reaches the silicon carbide layer of the first conductivity type;

a step of forming a protection trench that extends from the surface of the silicon carbide layer of the second conductivity type to a depth greater than the gate trench;

a step of providing a gate electrode in the gate trench with an insulating film interposed therebetween; and a step of providing a conductive member in the protection trench, wherein a region in a horizontal direction that includes both the gate trench and a protection trench that surrounds the gate trench with at least a part of the gate trench left unenclosed in the horizontal direction is a cell region, a region in the horizontal direction that includes a protection trench and in which a gate pad or a lead electrode connected to the gate pad is disposed is a gate region, the protection trench included in the cell region has a plurality of cell-region linear trench sections that extend straight in the horizontal direction, and a horizontal distance between the cell-region linear trench sections is greater than a maximum horizontal distance between sections of the protection trench included in the gate region.

A method of designing a silicon carbide semiconductor device according to the present invention, wherein the silicon carbide semiconductor device comprises:

a silicon carbide layer of a first conductivity type;

a silicon carbide layer of a second conductivity type formed on the silicon carbide layer of the first conductivity type;

a gate trench formed to extend from a surface of the silicon carbide layer of the second conductivity type to such a depth that the gate trench reaches the silicon carbide layer of the first conductivity type;

a gate electrode provided in the gate trench with an insulating film interposed therebetween;

a protection trench formed to extend from the surface of the silicon carbide layer of the second conductivity type to a depth greater than the gate trench; and a conductive member provided in the protection trench, a region in a horizontal direction that includes both the gate trench and a protection trench that surrounds the gate trench with at least a part of the gate trench left unenclosed in the horizontal direction is a cell region, a region in the horizontal direction that includes a protection trench and in which a gate pad or a lead electrode connected to the gate pad is disposed is a gate region, the protection trench included in the cell region has a plurality of cell-region linear trench sections that extend straight in the horizontal direction, and a horizontal distance between the cell-region linear trench sections is greater than a maximum horizontal distance between sections of the protection trench included in the gate region.

Advantageous Effects of Invention

According to the present invention, the horizontal distance between the cell-region linear trench sections is greater than the maximum horizontal distance between sections of the protection trench included in the gate region. Therefore, a higher electrical field is concentrated between the cell-region linear trench sections during reverse biasing. However, since the cell-region linear trench sections occupy a larger area in plan view, even if a high voltage is applied during reverse biasing, the energy is distributed over the larger area occupied by the cell-region linear trench sections. Therefore, according to the present invention, even if the silicon carbide semiconductor device made of silicon carbide adopts a protection trench, an electrical field can be prevented from being locally excessively concentrated during reverse biasing, and the avalanche resistance can be improved.

DESCRIPTION OF EMBODIMENTS

First Embodiment

<<Configuration>>

In the following, a silicon carbide semiconductor device, a method of manufacturing the silicon carbide semiconductor device and a method of designing the silicon carbide semiconductor device according to a first embodiment of the present invention will be described with reference to the drawings.

The silicon carbide semiconductor device according to this embodiment is a trench-structure MOSFET, for example. In the following, the silicon carbide semiconductor device will be described as the trench-structure MOSFET. However, the trench-structure MOSFET is only an example of the silicon carbide semiconductor device, and the present invention can be applied to other devices structures having a MOS gate, such as an insulated gate bipolar transistor (IGBT).

Figure 1:
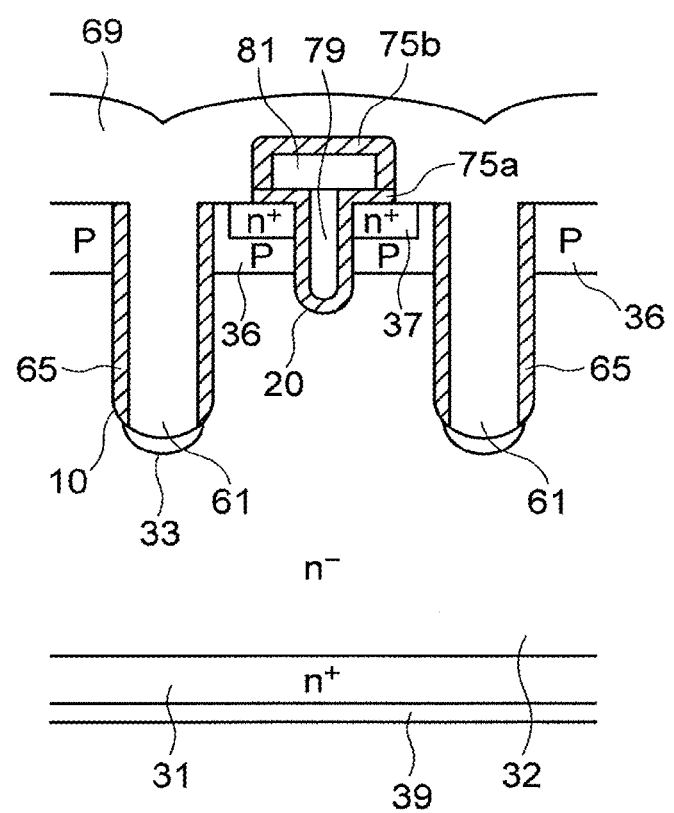
FIG. 1 is a cross-sectional view of a silicon carbide semiconductor device according to a first embodiment of the present invention, which shows a cross section of a part of the arrangement shown in FIG. 3 taken in a direction perpendicular to the sheet of FIG. 3.

As shown in FIG. 1, the silicon carbide semiconductor device according to this embodiment includes an n-type silicon carbide semiconductor substrate 31 of high concentration (a silicon carbide semiconductor substrate of a first conductivity type), an n-type silicon carbide layer 32 of low concentration (a silicon carbide layer of the first conductivity type) formed on the n-type silicon carbide semiconductor substrate 31 of high concentration, and a p-type silicon carbide layer 36 (a silicon carbide layer of a second conductivity type) formed on the n-type silicon carbide layer 32 of low concentration. An n-type silicon carbide region 37 containing a high concentration of impurities is formed in a part of a surface of the p-type silicon carbide layer 36.

According to this embodiment, a gate trench 20 is formed to extend from a surface of the n-type silicon carbide region 37 containing a high concentration of impurities to such a depth that the gate trench 20 penetrates the p-type silicon carbide layer 36 into the n-type silicon carbide layer 32 of low concentration. In the gate trench 20, a gate electrode 79 is provided with a gate insulating film 75a interposed therebetween. An interlayer insulating film 75b is provided on the gate electrode 79. That is, the gate electrode 79 is surrounded by the gate insulating film 75a and the interlayer insulating film 75b.

A protection trench 10 is formed to extend from the surface of the p-type silicon carbide layer 36 to a greater depth than the gate trench 20. In the protection trench 10, a first conductive member 61 made of polysilicon, for example, is provided. According to this embodiment, the first conductive member 61 is integrated with a source electrode 69 and is set at the same potential as the source electrode 69 when a voltage is applied (see FIG. 1). A side wall insulating film 65 is provided on a side wall of the protection trench 10.

According to this embodiment, a p-type semiconductor region 33 of high concentration is formed on a bottom of the protection trench 10 by ion implantation of aluminum or the like. A drain electrode 39 is provided on a back surface (lower surface in FIG. 1) of the n-type silicon carbide semiconductor substrate 31.

Figure 4:
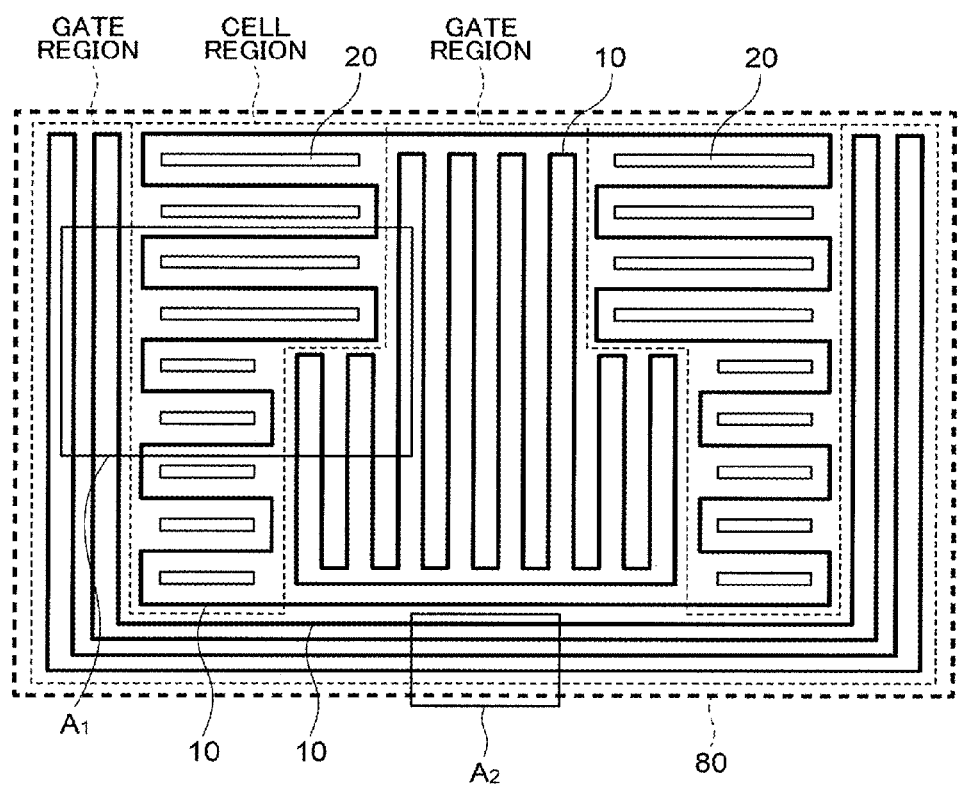
FIG. 4 is a schematic top view for illustrating a cell region and a gate region of the silicon carbide semiconductor device according to the first embodiment of the present invention.

As shown in FIG. 4, according to this embodiment, a region in a horizontal direction that includes both a gate trench 20 and a protection trench 10 that surrounds the gate trench 20 with at least a part of the gate trench 20 left unenclosed by the protection trench 10 is referred to as a "cell region". FIG. 4 is just a schematic top view for illustrating the cell region and a gate region of the silicon carbide semiconductor device according to this embodiment. FIG. 4 does not show any detailed structure of the protection trench 10 and does not take into account the distances between sections of the protection trench 10 in the horizontal direction. The sizes of the cell region and the gate region in the horizontal direction shown in FIG. 4 are not to scale.

As shown in FIG. 4, according to this embodiment, a region in the horizontal direction that includes a protection trench 10 and a gate pad 89 (see FIG. 2) or a lead electrode connected to the gate pad 89 is referred to as the "gate region". A second conductive member 81 is made of polysilicon, for example.

Figure 5:
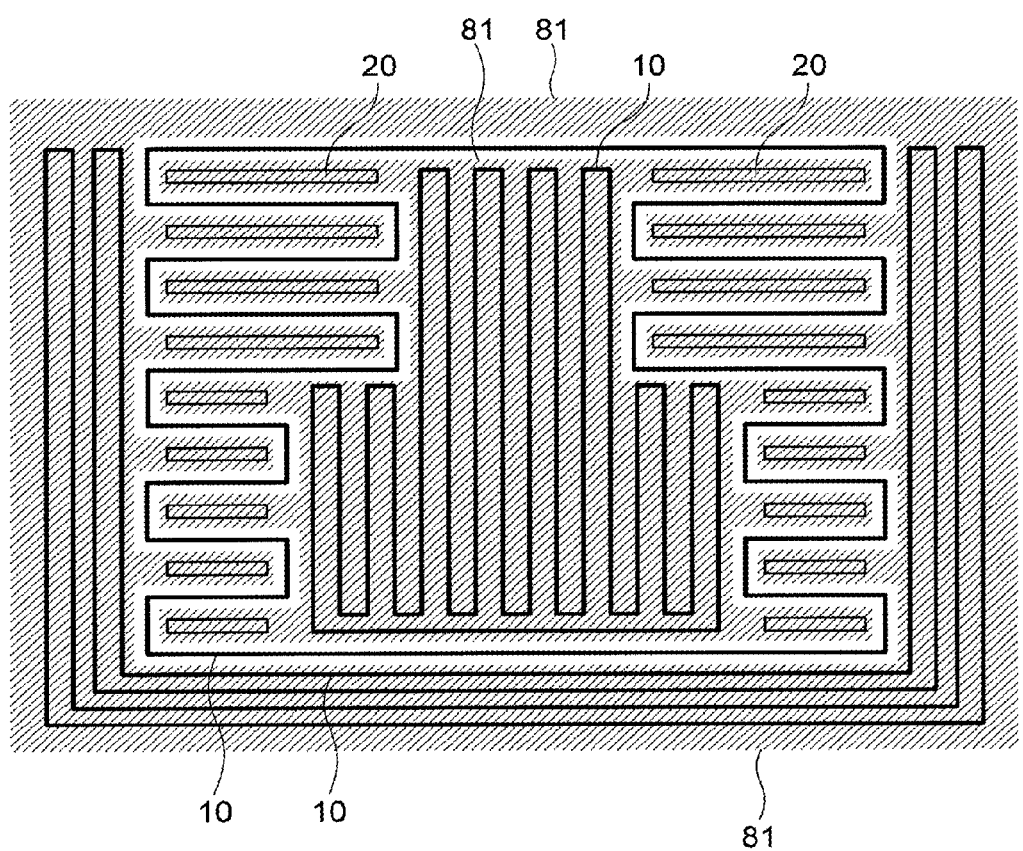
FIG. 5 is a schematic top view for illustrating an arrangement of a second conductive member of the silicon carbide semiconductor device according to the first embodiment of the present invention.

The gate pad 89 is disposed in the gate region shown in the central part of FIG. 4 (see FIG. 2), and the lead electrode is connected to the gate pad 89. As shown in FIG. 5, the second conductive member 81 is primarily disposed in an area other than above the protection trench 10 disposed in the cell region.

Figure 3:
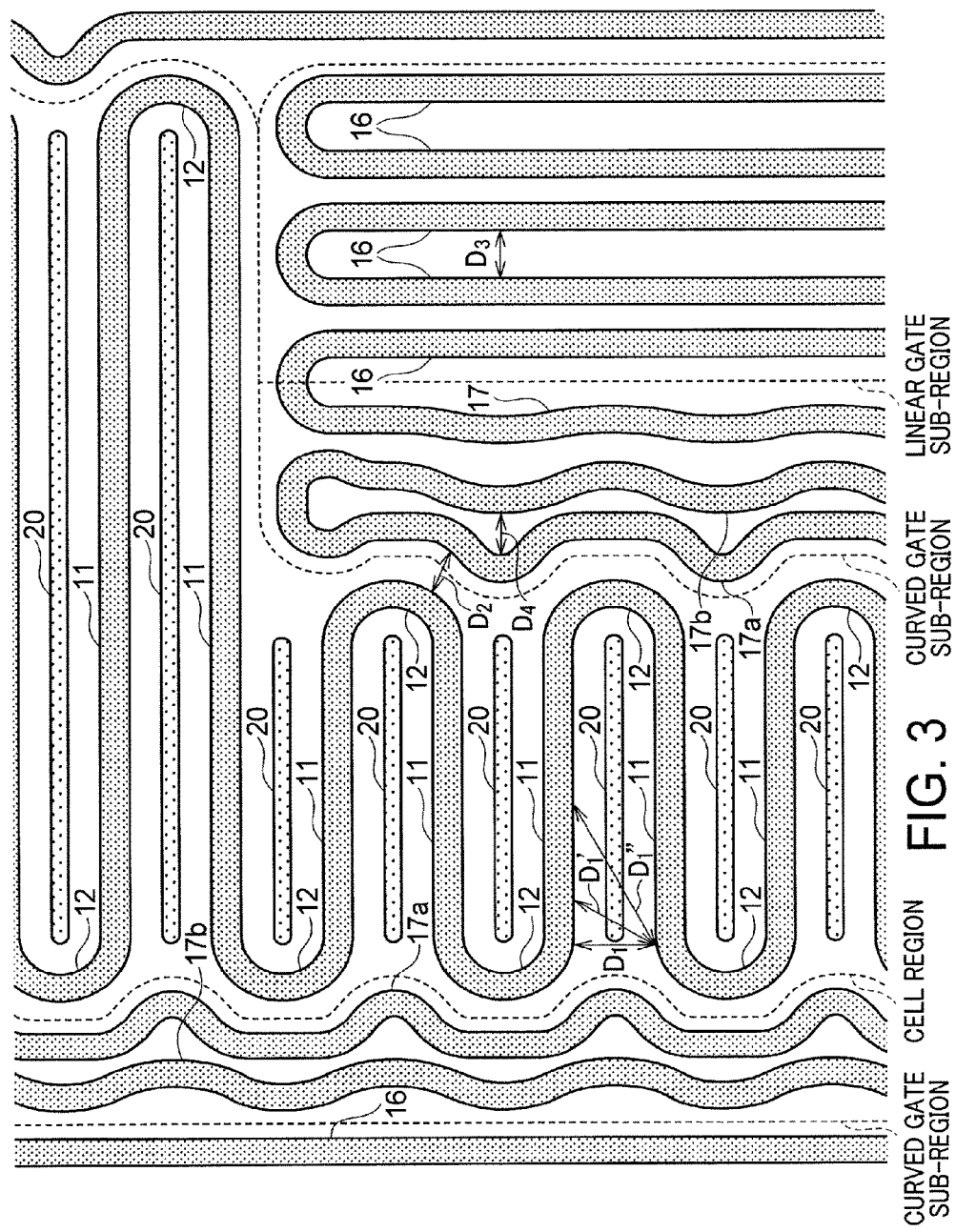
FIG. 3 is an enlarged top view of the silicon carbide semiconductor device according to the first embodiment of the present invention, which shows the part "$A_1$" in FIG. 4.

As shown in FIG. 3, the protection trench 10 included in the cell region includes a plurality of cell-region linear trench sections 11 that extends straight in the horizontal direction, and a horizontal distance between the cell-region linear trench sections 11 is longer than a maximum horizontal distance between the sections of the protection trench 10 included in the gate region. The "horizontal distance"

referred to in this embodiment means the "minimum distance" in the horizontal direction. Taking a cell-region linear trench section 11 as an example, it can be considered that there are an infinite number of distances from a point in the cell-region linear trench section 11 to an opposed cell-region linear trench section 11, such as "D1'" as well as "D1''" and "D1'''" shown in FIG. 3. According to this embodiment, however, since the "horizontal distance" is defined as the "minimum distance" in the horizontal direction as described above, the "horizontal distance" is not "D1'" or "D1''" but the minimum distance "D1'''".

In the implementation shown in FIG. 3, a horizontal distance "$D_1$" between cell-region linear trench sections 11 in the up-and-down direction in FIG. 3 is greater than a maximum horizontal distance "$D_3$" between the sections of the protection trench 10 included in the gate region.

According to this embodiment, the horizontal distance "$D_1$" between the cell-region linear trench sections 11 is greater than a maximum horizontal distance "$D_2$" between the protection trench 10 included in the cell region and the protection trench 10 included in the gate region.

A more specific description will be made with reference to FIG. 3. As shown in FIG. 3, the protection trench 10 included in the cell region according to this embodiment also has a cell-region curved trench section 12 that is curved in the horizontal direction. The horizontal distance "$D_1$" between the cell-region linear trench sections 11 is greater than the maximum horizontal distance "$D_2$" between the cell-region curved trench section 12 and a gate-region curved trench section 17 in a curved gate sub-region described later. Reference numeral "17" conceptually includes reference numerals "17a" and "17b" described later. The p-type semiconductor region 33 and the first conductive member 61 are in ohmic contact with each other and are set to the same potential when a voltage is applied.

As shown in FIG. 3, the protection trench 10 included in the gate region according to this embodiment has a gate-region linear trench section 16 that extends straight in the horizontal direction and a gate-region curved trench section 17 that is curved in the horizontal direction. More specifically, as shown in FIG. 3, the gate region includes a linear gate sub-region in which a plurality of gate-region linear trench sections 16 extend in the horizontal direction and a curved gate sub-region in which a plurality of gate-region curved trench sections 17 extend in the horizontal direction. The horizontal distance "$D_3$" between the gate-region linear trench sections 16 in the linear gate sub-region is greater than a maximum horizontal distance "$D_4$" between the gate-region curved trench sections 17 in the curved gate sub-region. According to this embodiment, the gate-region linear trench sections 16 in the linear gate sub-region are uniformly arranged, and the horizontal distances "$D_3$" between the gate-region linear trench sections 16 (the horizontal distances "$D_3$" in the left-and-right direction in FIG. 3) are the same.

The gate trench 20 according to this embodiment extends straight in the horizontal direction. More specifically, the gate trench 20 extends straight in the left-and-right direction in FIG. 3. The gate trench 20 and the cell-region linear trench sections 11 extend in parallel with each other (in the left-and-right direction in FIG. 3) in the horizontal direction.

As shown in FIG. 3, the protection trench 10 included in the cell region has a pair of cell-region linear trench sections 11 and a cell-region curved trench section 12 that is curved in the horizontal direction. The gate trench 20 extending straight in the horizontal direction (that is, extending in the left-and-right direction in FIG. 3) is located between the pair of cell-region linear trench sections 11, the cell-region curved trench section 12 is located at one end of the pair of cell-region linear trench sections 11, and the protection trench 10 is not formed at the other end of the pair of cell-region linear trench sections 11.

Figure 2:
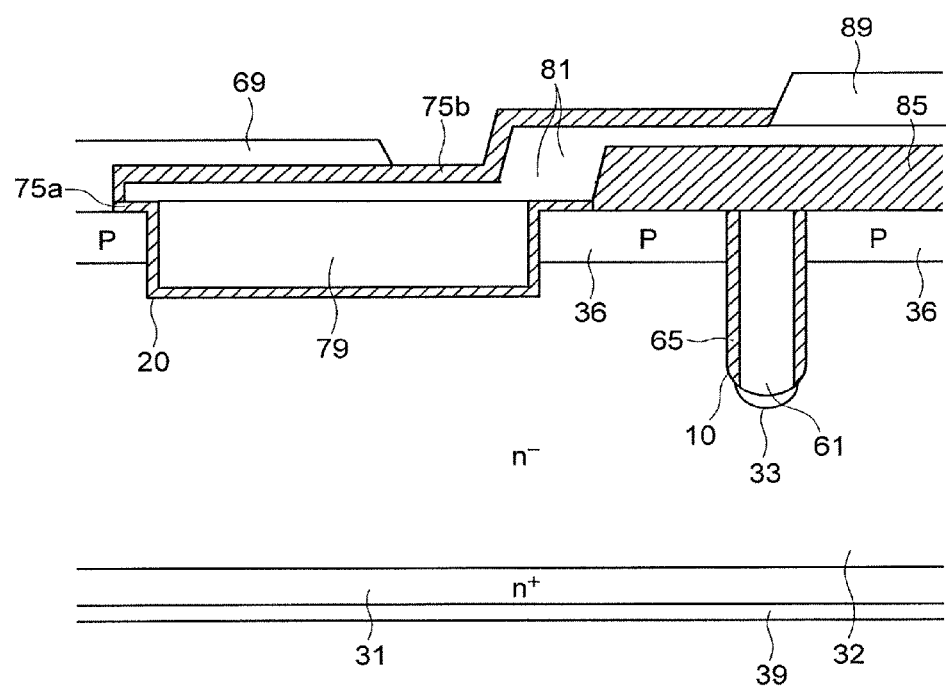
FIG. 2 is a cross-sectional view of the silicon carbide semiconductor device according to the first embodiment of the present invention, which shows a cross section of the arrangement shown in FIG. 3 taken in a left-and-right direction in the sheet of FIG. 3.

As shown in FIG. 2, the second conductive member 81 is provided above a part of the gate trench 20 in the cell region and in the gate region. The second conductive member 81 is disposed in an area of the cell region where the protection trench 10 is not provided, that is, according to this embodiment, over an area that extends from above the gate trench 20 in the cell region into the gate region through above the other end of the pair of cell-region linear trench sections 11 (see FIG. 5). Thus, the second conductive member 81 is provided to extend from above the gate electrode 79 into below the gate pad 89 through above the other end of the pair of cell-region linear trench sections 11. As shown in FIG. 2, the gate pad 89 is provided on the protection trench 10 in the gate region with an insulating layer 85 of $SiO_2$ or the like interposed therebetween. As is obvious from FIG. 2, the second conductive member 81 is electrically connected to the gate electrode 79.

As shown in FIG. 3, a gate-region curved trench section 17a that protrudes toward the gate trench 20 in the horizontal direction is provided at the other end of the pair of cell-region linear trench sections 11. A gate-region curved trench section 17b that protrudes toward the gate-region curved trench section 17a that protrudes toward the gate trench 20 is provided adjacent to the gate-region curved trench section 17a.

According to this embodiment, as shown in FIG. 3, the protection trench 10 included in the cell region has three or more cell-region linear trench sections 11 that extend straight in the horizontal direction. The cell-region linear trench sections 11 according to this embodiment are uniformly disposed, and the horizontal distances "$D_1$" between the cell-region linear trench sections 11 are the same. That is, the horizontal distances "$D_1$" between the cell-region linear trench sections 11 in the up-and-down direction in FIG. 3 are the same.

As shown in FIG. 4, according to this embodiment, a guard ring 80 that surrounds the gate region and the cell region in the horizontal direction is provided. Although FIG. 4 shows only one guard ring 80, in actual, a plurality of guard rings 80 may be concentrically provided.

According to this embodiment, the smaller the radius of curvature of the cell-region curved trench section 12, the smaller the horizontal distance between the cell-region curved trench section 12 and the protection trench 10 in the gate region adjacent to the cell-region curved trench section 12 can be. Furthermore, the smaller the radius of curvature of the gate-region curved trench section 17, the smaller the horizontal distance between the gate-region curved trench section 17 and the protection trench 10 in the gate region adjacent to the gate-region curved trench section 17 can be.

<<Manufacturing Process>>

Figure 6:
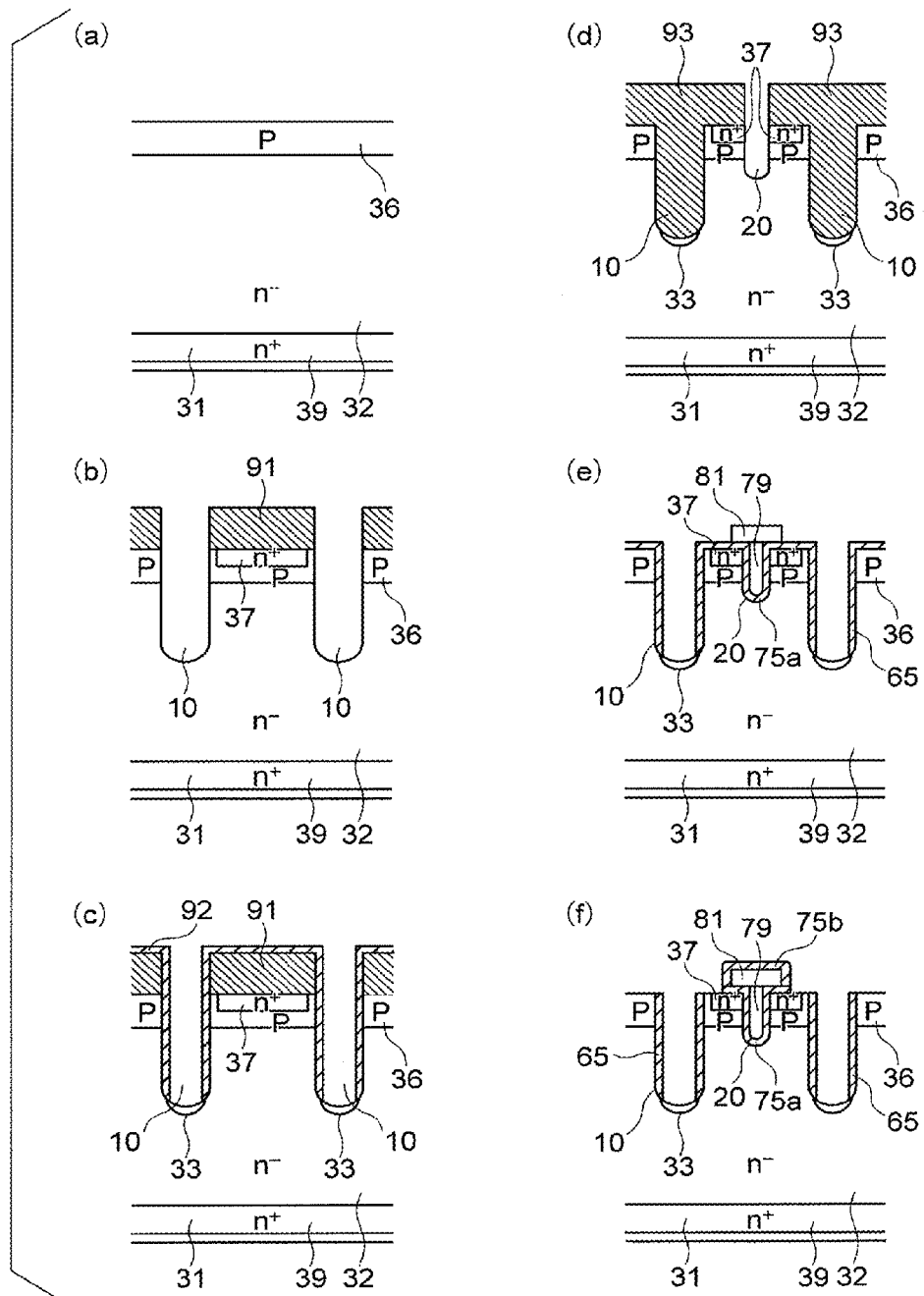
FIG. 6 are cross-sectional views for illustrating a method of manufacturing the silicon carbide semiconductor device according to the first embodiment of the present invention, which correspond to the cross-sectional view of FIG. 1.

Next, a process of manufacturing the silicon carbide semiconductor device according to this embodiment configured as described above will be described mainly with reference to FIGS. 6. According to this embodiment, the process of manufacturing the silicon carbide semiconductor device includes a method of designing the silicon carbide semiconductor device manufactured as described below.

First, the n-type silicon carbide semiconductor substrate 31 of high concentration is prepared (see FIG. 6(a)).

The n-type silicon carbide layer 32 of low concentration is then formed by epitaxial growth on the n-type silicon carbide semiconductor substrate 31 of high concentration.

The p-type silicon carbide layer 36 is then formed on the n-type silicon carbide layer 32 of low concentration by epitaxial growth or ion implantation.

The n-type silicon carbide region 37 containing a high concentration of impurities is then formed by phosphorus ion implantation or the like in a part of the p-type silicon carbide layer 36 where the gate trench 20 is to be formed and a vicinity area thereof. A protection layer 91 is then deposited, and the protection layer 91 is patterned to form an opening through which the protection trench 10 is formed (see FIG. 6(b)). Using the protection layer 91 as a mask, the protection trench 10 is then formed to extend from the surface of the p-type silicon carbide layer 36 to such a depth that the protection trench 10 reaches the n-type silicon carbide layer 32 of low concentration.

A protection film 92 is then formed to cover the protection layer 91 and the protection trench 10 (see FIG. 6(c)).

A part of the protection film 92, which is on the bottom of the protection trench 10, is then removed. Using the remaining protection film 92 as a mask, ion implantation of aluminum or the like is performed on the bottom of the protection trench 10 to form the p-type semiconductor region 33 containing a high concentration of impurities. After that, the protection film 92 and the protection layer 91 are removed. After that, activation annealing is performed.

A protection layer 93 is then deposited, and the protection layer 93 is patterned to form an opening through which the gate trench 20 is formed (see FIG. 6(d)). Using the protection layer 93 as a mask, the gate trench 20 is then formed to extend from the surface of the p-type silicon carbide layer 36 to such a depth that the gate trench 20 reaches the n-type silicon carbide layer 32 of low concentration. The depth of the gate trench 20 is smaller than the depth of the protection trench 10. After that, the protection layer 93 is removed.

A heat treatment is then performed on the surface of the silicon carbide semiconductor device including the gate trench 20 and the protection trench 10 to form an oxide film that is to form the gate insulating film 75a and the side wall insulating film 65. A conductive material, such as polysilicon, is then deposited on the gate insulating film 75a. After the deposition, a heat treatment may be performed as required. In this way, the gate electrode 79 and the second conductive member 81 are formed on the gate trench 20 as shown in FIG. 6(e).

An insulating film of silicon dioxide ($SiO_2$) or the like is then formed by plasma CVD or the like to cover the surface of the silicon carbide semiconductor device including the protection trench 10, thereby forming the interlayer insulating film 75b on the gate electrode 79 so that the gate electrode 79 is surrounded by the gate insulating film 75a and the interlayer insulating film 75b (see FIG. 6(f)). In addition, the insulating film on the bottom of the protection trench 10 is selectively removed by etching, leaving only the side wall insulating film 65 on the side wall of the protection trench 10.

After that, the first conductive member 61, the insulating layer 85, the second conductive member 81, the gate pad 89, the source electrode 69, the drain electrode 39, the lead electrode and the like are provided as required. In this way, the silicon carbide semiconductor device according to this embodiment is manufactured (see FIGS. 1 and 2).

The arrangement of the protection trench 10 of the silicon carbide semiconductor device manufactured as described above in the horizontal plane is as described above in the section <<Configuration>>. The manufacturing method described above is just an example, and any manufacturing method that can manufacture the silicon carbide semiconductor device described in the claims can be adopted.

<<Effects and Advantages>>

Next, effects and advantages of this embodiment will be described.

According to this embodiment, the horizontal distance "$D_1$" between the cell-region linear trench sections 11 is greater than the maximum horizontal distance "$D_3$" between the sections of the protection trench 10 included in the gate region (see FIG. 3). Therefore, during reverse biasing, a higher electrical field is concentrated between the cell-region linear trench sections 11. In plan view, however, since the cell-region linear trench sections 11 generally occupy a larger area, the energy is distributed over the larger area occupied by the cell-region linear trench sections 11 even if a high voltage is applied during reverse biasing. Therefore, the silicon carbide semiconductor device provided with the protection trench 10 according to this embodiment can prevent an electrical field from being locally concentrated during reverse biasing and therefore can improve the avalanche resistance.

This will now be described.

The silicon carbide semiconductor device made of silicon carbide, such as a SiC-MOSFET, has a high breakdown voltage, so that the gate trench 20 can be insufficient to prevent the electrical field from excessively concentrated in the gate oxide film during reverse biasing, and the gate oxide film can break. To avoid this, the protection trench 10 can be disposed around the gate trench 20 to prevent an excessive electrical field from being applied to the gate trench 20. However, such a protection trench 10 can fail to prevent an electrical field from being locally concentrated because of the interval between the sections of the protection trench 10 or the shape of the protection trench 10 in the horizontal direction (viewed from the normal direction to the surface of the semiconductor device), for example. In particular, the electrical field applied to the protection trench 10 increases as the horizontal distance between the sections of the protection trench 10 increases.

In this respect, according to this embodiment, the horizontal distance "$D_1$" between the sections of the cell-region linear trench sections 11 is greater than the maximum horizontal distance "$D_3$" between the sections of the protection trench 10 included in the gate region. Therefore, even if a high voltage is applied during reverse biasing, the electrical field can be concentrated between the cell-region linear trench sections 11, rather than between the sections of the protection trench 10 included in the gate region. Furthermore, even if the electrical field is concentrated between the cell-region linear trench sections 11 in this way, the electrical field is less likely to be locally excessively concentrated, since the area of the cell region in which the gate electrode 79 is disposed in the horizontal direction is generally large (at least larger than the area of the gate region in the horizontal direction), and the electrical field can be distributed among the cell-region linear trench sections 11. As described earlier, FIG. 4 is just a schematic top view for illustrating the cell region and the gate region of the silicon carbide semiconductor device according to this embodiment, and the sizes of the cell region and the gate region in the horizontal direction shown in FIG. 4 are not to scale.

According to this embodiment, as shown in FIG. 3, the gate trench 20 extends straight in the left-and-right direction in FIG. 3 in the horizontal direction, and the gate trench 20 and the cell-region linear trench sections 11 extend in parallel with each other in the left-and-right direction in FIG. 3 in the horizontal direction. On the other hand, the cell-region curved trench section 12 is provided only at one end of the pair of cell-region linear trench sections 11. As can be seen from this fact, in the cell region, the cell-region linear trench sections 11 occupy a significantly larger area in the horizontal direction than the cell-region curved trench section 12.

Furthermore, according to this embodiment, the horizontal distance "$D_1$" between the cell-region linear trench sections 11 is greater than the maximum horizontal distance "$D_2$" between the protection trench 10 included in the cell region and the protection trench 10 included in the gate region. More specifically, the horizontal distance "$D_1$" between the cell-region linear trench sections 11 is greater than the maximum horizontal distance "$D_2$" between the cell-region curved trench section 12 and the gate-region curved trench section 17 in the curved gate sub-region (see FIG. 3). Therefore, even if a high voltage is applied during reverse biasing, the electrical field can be concentrated between the cell-region linear trench sections 11, rather than between the cell-region curved trench section 12 and the protection trench 10 included in the gate region. Furthermore, as described above, even if the electrical field is concentrated between the cell-region linear trench sections 11 in this way, the electrical field is less likely to be locally excessively concentrated, since the area of the cell region in the horizontal direction is generally large (at least larger than the area of the gate region in the horizontal direction), and the electrical field can be distributed among the cell-region linear trench sections 11.

Furthermore, according to this embodiment, the horizontal distance "$D_3$" between the gate-region linear trench sections 16 in the linear gate sub-region is greater than the maximum horizontal distance "$D_4$" between the gate-region curved trench sections 17 in the curved gate sub-region (see FIG. 3). Therefore, even if a high voltage is applied during reverse biasing and a relatively high electrical field occurs in the gate region, the electrical field can be concentrated between the gate-region linear trench sections 16, rather than between the gate-region curved trench sections 17. In this respect, since the area of the linear gate sub-region in the horizontal direction is generally larger than the area of the curved gate sub-region in the horizontal direction, the electrical field can be prevented from being locally excessively concentrated between the gate-region curved trench sections 17, which occupy a smaller area in the horizontal direction.

Furthermore, according to this embodiment, as shown in FIG. 3, the gate-region curved trench section 17a that protrudes toward the gate trench 20 in the horizontal direction is provided at the other end of the pair of cell-region linear trench sections 11. Therefore, the horizontal distance between the protection trench 10 included in the cell region and the gate-region curved trench section 17 can be reduced. As a result, during reverse biasing, the electrical field that occurs between the protection trench 10 included in the cell region and the gate-region curved trench section 17 can be reduced, and the electrical field can be prevented from being locally excessively concentrated in this area.

Furthermore, according to this embodiment, as shown in FIG. 3, the gate-region curved trench section 17b that protrudes toward the gate-region curved trench section 17a, which protrudes toward the gate trench 20, is provided adjacent to the gate-region curved trench section 17a. Therefore, the horizontal distance between the gate-region curved trench section 17a that protrudes toward the gate trench 20 and the gate-region curved trench section 17b that is adjacent to the gate-region curved trench section 17a can be reduced. As a result, during reverse biasing, the electrical field that occurs between the gate-region curved trench sections 17 can be reduced, and the electrical field can be prevented from being locally excessively concentrated in this area.

Furthermore, according to this embodiment, the horizontal distances "$D_1$" between the cell-region linear trench sections 11 are uniform and the same. Therefore, the electrical field that occurs between the cell-region linear trench sections 11 can be uniformly distributed, and the magnitude of the electrical field that occurs between the cell-region linear trench sections 11 during reverse biasing can be prevented from varying. As a result, the electrical field can be prevented, with higher reliability, from being locally excessively concentrated.

Furthermore, if the implementation is adopted in which the smaller the radius of curvature of the cell-region curved trench section 12, the smaller the horizontal distance between the cell-region curved trench section 12 and the protection trench 10 in the gate region adjacent to the cell-region curved trench section 12 is, the electrical field can be prevented from being locally excessively concentrated in the part of the cell-region curved trench section 12 of the small radius of curvature during reverse biasing.

Furthermore, if the implementation is adopted in which the smaller the radius of curvature of the gate-region curved trench section 17, the smaller the horizontal distance between the gate-region curved trench section 17 and the protection trench 10 in the gate region adjacent to the gate-region curved trench section 17 is, the electrical field can be prevented from being locally excessively concentrated in the part of the gate-region curved trench section 17 of the small radius of curvature during reverse biasing.

Second Embodiment

Figure 7:
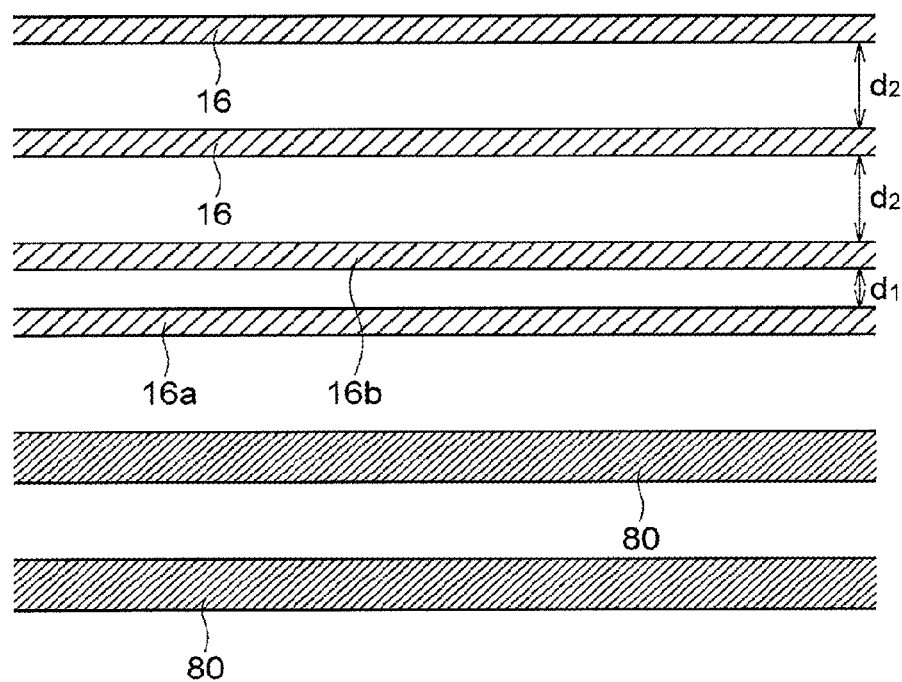
FIG. 7 is an enlarged top view of a guard ring and a vicinity thereof of a silicon carbide semiconductor device according to a second embodiment of the present invention, which shows a part corresponding to the part "$A_2$" in FIG. 4.

Next, a second embodiment of the present invention will be described. FIG. 7, which is used in the description of this embodiment, is an enlarged top view of a guard ring of a silicon carbide semiconductor device according to this embodiment and a vicinity thereof. Specifically, FIG. 7 is a top view of the part "$A_2$" in FIG. 4.

According to the first embodiment, the protection trench 10 included in the gate region has three or more gate-region linear trench sections 16 that extend straight in the horizontal direction, although no mention has been made as to the relationship between the gate-region linear trench sections 16 and the guard ring 80. In this respect, according to the second embodiment, three or more gate-region linear trench sections 16 are provided adjacent to a part of the guard ring 80 and in parallel with the guard ring 80. And a horizontal distance "$d_1$" between the gate-region linear trench section 16a adjacent to the guard ring 80 and the gate-region linear trench section 16b adjacent to the gate-region linear trench section 16a is smaller than a minimum horizontal distance "$d_2$" between the other gate-region linear trench sections 16 in the area (the area occupied by the gate-region linear trench sections 16 provided in parallel with the guard ring 80). Reference numeral "16" conceptually includes reference numerals "16a" and "16b".

More specifically, of the gate-region linear trench sections 16 that extend straight in the left-and-right direction in FIG. 7, the horizontal distance "$d_1$" between the lowermost gate-region linear trench section 16a and the gate-region linear trench section 16b adjacent to the gate-region linear trench section 16a is smaller than the minimum horizontal distance "$d_2$" between the other gate-region linear trench sections 16. In the part shown in FIG. 7, the gate-region linear trench sections 16 are uniformly arranged, and the horizontal distances "$d_2$" between the other gate-region linear trench sections 16 are the same.

The remainder of the configuration according to the second embodiment is substantially the same as the configuration according to the first embodiment. In the second embodiment, the same components as those in the first embodiment are denoted by the same reference numerals, and detailed descriptions thereof are omitted.

This embodiment has advantageous effects similar to those of the first embodiment. Since the advantageous effects have already been described in detail with regard to the first embodiment, the description of the advantageous effects of this embodiment will be focused only on those specific to this embodiment.

As described above, according to this embodiment, the horizontal distance "$d_1$" between the gate-region linear trench section 16a adjacent to the guard ring 80 and the gate-region linear trench section 16b adjacent to the gate-region linear trench section 16a is smaller than the horizontal distance "$d_2$" between the other gate-region linear trench sections 16. Therefore, if this embodiment is adopted, in addition to the advantageous effects of the first embodiment, the electrical field can be prevented from being concentrated in a peripheral part close to the guard ring 80 during reverse biasing. Therefore, when the protection trench 10 is adopted, the avalanche resistance can be advantageously improved in the peripheral part close to the guard ring 80.

Finally, the embodiments described above and shown in the drawings are given only as examples for the purpose of illustration of the present invention set forth in the claims and do not limit the present invention set forth in the claims.

REFERENCE SIGNS LIST

10 protection trench
11 cell-region linear trench section
12 cell-region curved trench section
16 gate-region linear trench section
16a gate-region linear trench section
16b gate-region linear trench section
17 gate-region curved trench section
17a gate-region curved trench section
17b gate-region curved trench section
20 gate trench
31 n-type silicon carbide semiconductor substrate (silicon carbide semiconductor substrate of first conductivity type)
32 n-type silicon carbide layer (silicon carbide layer of first conductivity type)
36 p-type silicon carbide layer (silicon carbide layer of second conductivity type)
61 first conductive member (conductive member)
69 source electrode
79 gate electrode
80 guard ring

The invention claimed is:
1. A silicon carbide semiconductor device, comprising:
a silicon carbide layer of a first conductivity type;
a silicon carbide layer of a second conductivity type formed on the silicon carbide layer of the first conductivity type;
a gate trench formed to extend from a surface of the silicon carbide layer of the second conductivity type to such a depth that the gate trench reaches the silicon carbide layer of the first conductivity type;
a gate electrode provided in the gate trench with an insulating film interposed therebetween;
first and second protection trenches formed to extend from the surface of the silicon carbide layer of the second conductivity type to a depth greater than the gate trench; and
a conductive member provided in the first and second protection trenches,
wherein a cell region in a horizontal extent that includes both the gate trench and the first protection trench that surrounds the gate trench with at least a part of the gate trench left unenclosed in the horizontal extent, and
a gate region in the horizontal extent that includes the second protection trench and in which a gate pad or a lead electrode connected to the gate pad is disposed,
the first protection trench included in the cell region has a plurality of cell-region linear trench sections that extend straight in the horizontal extent, and
a horizontal distance between opposed cell-region linear trench sections is greater than a maximum horizontal distance between opposed sections of the second protection trench included in the gate region.

2. The silicon carbide semiconductor device according to claim 1, wherein the horizontal distance between opposed cell-region linear trench sections is greater than a maximum horizontal distance between the first protection trench included in the cell region and the adjacent second protection trench included in the gate region.

3. The silicon carbide semiconductor device according to claim 2, wherein the first protection trench included in the cell region has a cell-region curved trench section that is curved in the horizontal extent and located at an end of the cell-region linear trenches, and
the horizontal distance between the opposed cell-region linear trench sections is greater than a maximum horizontal distance between the cell-region curved trench section and the adjacent second protection trench included in the gate region.

4. The silicon carbide semiconductor device according to claim 1, wherein the second protection trench included in the gate region has a gate-region linear trench section that extends straight in the horizontal extent and a gate-region curved trench section that is curved in the horizontal extent,
the gate region includes a linear gate sub-region in which a plurality of gate-region linear trenches extend in the horizontal extent and a curved gate sub-region in which a plurality of gate-region curved trench sections extend in the horizontal extent, and
a horizontal distance between the gate-region linear trench sections in the linear gate sub-region is greater than a horizontal distance between the gate-region curved trench sections in the curved gate sub-region.

5. The silicon carbide semiconductor device according to-claims 1, wherein the gate trench extends straight in the horizontal extent.

6. The silicon carbide semiconductor device according to claim 5, wherein the gate trench and the cell-region linear trench sections extend in parallel with each other in the horizontal extent.

7. The silicon carbide semiconductor device according to claim 5, wherein the first protection trench included in the cell region has a pair of cell-region linear trench sections and a cell-region curved trench section that is curved in the horizontal extent,
the cell-region curved trench is located at a first end of the pair of cell-region linear trench sections, and the gate trench is located between the pair of cell-region linear trench sections in the horizontal extent.

8. The silicon carbide semiconductor device according to claim 7, wherein the second protection trench included in the gate region has a gate-region curved trench section that is curved in the horizontal extent, and
a gate-region curved trench section that protrudes toward the gate trench in the horizontal extent is disposed at a second end of the pair of cell-region linear trench sections.

9. The silicon carbide semiconductor device according to claim 8, wherein a gate-region curved trench section that protrudes toward the gate-region curved trench section that protrudes toward the gate trench is provided adjacent to the gate-region curved trench section that protrudes toward the gate trench.

10. The silicon carbide semiconductor device according to 1, wherein the first protection trench included in the cell region has three or more cell-region linear trench sections that extend straight in the horizontal extent, and
the horizontal distances between the cell-region linear trench sections are uniform.

11. The silicon carbide semiconductor device according to claim 1, further comprising:
a guard ring that surrounds the gate region and the cell region in the horizontal extent,
wherein the second protection trench included in the gate region has three or more gate-region linear trench sections that extend straight in the horizontal extent,
the gate-region linear trenches are provided adjacent to, and in parallel with, at least a part of the guard ring, and
a horizontal distance between the gate-region linear trench section that is closest to the guard ring and the gate-region linear trench section that is adjacent to the gate-region linear trench section that is closest to the guard ring is smaller than a minimum horizontal distance between the other adjacent gate-region linear trench sections.

12. A method of manufacturing a silicon carbide semiconductor device, comprising:
forming a silicon carbide layer of a first conductivity type;
forming a silicon carbide layer of a second conductivity type on the silicon carbide layer of the first conductivity type;
forming a gate trench that extends from a surface of the silicon carbide layer of the second conductivity type to a depth that the gate trench reaches the silicon carbide layer of the first conductivity type;
forming first and second protection trenches that extend from the surface of the silicon carbide layer of the second conductivity type to a depth greater than the gate trench;
providing a gate electrode in the gate trench with an insulating film interposed therebetween; and
providing a conductive member in the first and second protection trenches,
wherein a cell region in a horizontal extent that includes both the gate trench and the first protection trench that surrounds the gate trench with at least a part of the gate trench left unenclosed in the horizontal extent, and
a gate region in the horizontal extent that includes the second protection trench and in which a gate pad or a lead electrode connected to the gate pad is disposed,
the first protection trench included in the cell region has a plurality of cell-region linear trench sections that extend straight in the horizontal extent, and
a horizontal distance between opposed cell-region linear trench sections is greater than a maximum horizontal distance between opposed sections of the second protection trench included in the gate region.

13. A method of designing a silicon carbide semiconductor device, wherein the silicon carbide semiconductor device comprises:
a silicon carbide layer of a first conductivity type;
a silicon carbide layer of a second conductivity type formed on the silicon carbide layer of the first conductivity type;
a gate trench formed to extend from a surface of the silicon carbide layer of the second conductivity type to such a depth that the gate trench reaches the silicon carbide layer of the first conductivity type;
a gate electrode provided in the gate trench with an insulating film interposed therebetween;
first and second protection trenches formed to extend from the surface of the silicon carbide layer of the second conductivity type to a depth greater than the gate trench; and
a conductive member provided in the first and second protection trenches,
a cell region in a horizontal extent that includes both the gate trench and the first protection trench that surrounds the gate trench with at least a part of the gate trench left unenclosed in the horizontal extent,
a gate region in the horizontal extent that includes the second protection trench and in which a gate pad or a lead electrode connected to the gate pad is disposed,
the first protection trench included in the cell region has a plurality of cell-region linear trench sections that extend straight in the horizontal extent, and
a horizontal distance between opposed cell-region linear trench sections is greater than a maximum horizontal distance between opposed sections of the second protection trench included in the gate region.

* * * * *